United States Patent [19]
Taillebois et al.

[11] Patent Number: 4,769,630
[45] Date of Patent: Sep. 6, 1988

[54] INCREMENTAL OPTICAL CODE READER, PARTICULARLY OF THE WHOLLY INTEGRATED TYPE

[75] Inventors: Jacques Taillebois, Plaisir; Paul Gambs, Ecully; Jean-Marie Renaud, Courbevoie, all of France

[73] Assignee: M.C.B., Courbevoie, France

[21] Appl. No.: 888,423

[22] Filed: Jul. 23, 1986

[30] Foreign Application Priority Data

Jul. 30, 1985 [FR] France ................................ 85 11611

[51] Int. Cl.⁴ ............................................. H03M 1/22
[52] U.S. Cl. .................................. 341/8; 250/231 SE; 341/13
[58] Field of Search ............... 340/347 P; 250/231 SE

[56] References Cited

U.S. PATENT DOCUMENTS

| | | | |
|---|---|---|---|
| 3,729,621 | 4/1973 | Taisne | 340/347 P |
| 4,410,798 | 10/1983 | Breslow | 250/231 SE |
| 4,580,047 | 4/1986 | Sasaki | 250/231 SE |
| 4,644,157 | 2/1987 | Ozawa | 340/347 P |
| 4,649,267 | 3/1987 | Ray | 250/231 SE |

Primary Examiner—Charles D. Miller
Attorney, Agent, or Firm—Antonelli, Terry & Wands

[57] ABSTRACT

An incremental optical code reader of the wholly integrated type including a reading assembly, a pair of photodiodes, a differential amplifier receiving the outputs of the photodiodes and a trigger connected to the output of the amplifier. An electronic assembly with "exclusive OR" logic gates, AND logic gates and OR logic gates, receiving the outputs of the triggers for the channels and feeding into the outputs.

8 Claims, 7 Drawing Sheets

| PA | PB | PC | PD | PE | S1 | S2 |
|---|---|---|---|---|---|---|
| 0 | 0 | 0 | X | X | 1 | 2 |
| 1 | 0 | 0 | X | X | 4 | 5 |
| 0 | 1 | 0 | X | X | $\overline{1 \oplus 2}$ | 6 |
| 1 | 1 | 0 | X | X | 8 | 9 |
| 0 | 0 | 1 | X | X | 11 | 12 |
| 1 | 0 | 1 | X | X | 13 | 14 |
| 0 | 1 | 1 | X | X | $\overline{12 \oplus 11}$ | $\overline{\overline{4 \oplus 5} \oplus 10}$ |
| 1 | 1 | 1 | X | X | $\overline{9 \oplus 8}$ | 7 |

FIG. 6.

| PA | PB | PC | PD | PE | Top 0 (To) |
|---|---|---|---|---|---|
| 0 | 0 | 0 | 1 | X | 3.1.2. |
| 1 | 0 | 0 | 1 | X | 3.4.5. |
| 0 | 1 | 0 | 1 | X | 3.6. $\overline{(1 \oplus 2)}$ |
| 1 | 1 | 0 | 1 | X | 3.1.2.8.9. |
| 0 | 0 | 1 | 1 | X | 3.1.2.11.12 |
| 1 | 0 | 1 | 1 | X | 3.6. $\overline{(1 \oplus 2)}$.13.14 |
| 0 | 1 | 1 | 1 | X | 3.4.5. $\overline{(11 \oplus 12)}$ . $\overline{(\overline{4 \oplus 5} \oplus 10)}$ |
| 1 | 1 | 1 | 1 | X | 3.4.5. $\overline{(8 \oplus 9)}$.7 |
| X | X | X | 0 | X | 7 |

FIG. 7.

| PA | PB | PC | PD | PE | Ss |
|---|---|---|---|---|---|
| X | X | X | X | 0 | $\overline{\overline{11 \oplus 12} \oplus \overline{10 \oplus 5 \oplus 4}}$ |
| X | X | X | X | 1 | $\overline{11 \oplus 12}$ |

$\oplus$    for "exclusive OR"
$\cdot$    for "AND"

| R | S | PA | PB | PC | PD | PE |
|---|---|----|----|----|----|----|
| 1000 | $v_1$ $v_2$ Top | 0 | 0 | 0 | | |
| 1250 | $v_1$ $v_2$ Top | 1 | 0 | 0 | | |
| 2000 | $v_1$ $v_2$ Top | 0 | 1 | 0 | | |
| 2048 | $v_1$ $v_2$ Top | 1 | 1 | 0 | | |
| 2500 | $v_1$ $v_2$ Top | 0 | 0 | 1 | | |
| 3600 | $v_1$ $v_2$ Top | 1 | 0 | 1 | | |
| 5000 | $v_1$ $v_2$ Top | 0 | 1 | 1 | | |
| | | | | | | |
| 5000 10000 | $v_3$ | V max 2 V max | | | 1 0 | 1 0 |
| | Top | Normal 30° | | | | |

FIG.10.

| R | S | PA | PB | PC | PD | PE |
|---|---|----|----|----|----|----|
| 200 | $v_1$ $v_2$ Top | 0 | 0 | 0 | | |
| 250 | $v_1$ $v_2$ Top | 1 | 0 | 0 | | |
| 400 | $v_1$ $v_2$ Top | 0 | 1 | 0 | | |
| 512 | $v_1$ $v_2$ Top | 1 | 1 | 0 | | |
| 500 | $v_1$ $v_2$ Top | 0 | 0 | 1 | | |
| 720 | $v_1$ $v_2$ Top | 1 | 0 | 1 | | |
| 1000 | $v_1$ $v_2$ Top | 0 | 1 | 1 | | |
| 1024 | $v_1$ $v_2$ Top | 1 | 1 | 1 | | |
| 1000 2000 | $v_3$ | V max 2 V max | | | 1 0 | 1 0 |
| | Top | Normal | | | | |

FIG.11.

| R | S | PA | PB | PC | PD | PE |
|---|---|----|----|----|----|----|
| 100 | $v_1$ $v_2$ Top | 0 | 0 | 0 | | |
| 125 | $v_1$ $v_2$ Top | 1 | 0 | 0 | | |
| 200 | $v_1$ $v_2$ Top | 0 | 1 | 0 | | |
| 256 | $v_1$ $v_2$ Top | 1 | 1 | 0 | | |
| 250 | $v_1$ $v_2$ Top | 0 | 0 | 1 | | |
| 360 | $v_1$ $v_2$ Top | 1 | 0 | 1 | | |
| 500 | $v_1$ $v_2$ Top | 0 | 1 | 1 | | |
| 512 | $v_1$ $v_2$ Top | 1 | 1 | 1 | | |
| 500 1000 | $v_3$ | V max 2 V max | | | 1 0 | 1 0 |
| | Top | Normal | | | | |

FIG.12.

3600 = Vd 14 (LSB)
3600 = Vd 13
2500 = Vd 12
2500 = Vd 11
2500 = Vd 10
2048 = Vd 9
2048 = Vd 8
Top 30° = Vd 7
2000 = Vd 6
1250 = Vd 5
1250 = Vd 4
Top 0 = Vd 3
1000 = Vd 2
1000 = Vd 1 (MSB)

FIG.13.

720 = Vd 14 (LSB)
720 = Vd 13
500 = Vd 12
500 = Vd 11
500 = Vd 10
512 = Vd 9
512 = Vd 8
1024 = Vd 7
400 = Vd 6
250 = Vd 5
250 = Vd 4
Top = Vd 3
200 = Vd 2
200 = Vd 1 (MSB)

FIG.14.

360 = Vd 14 (LSB)
360 = Vd 13
250 = Vd 12
250 = Vd 11
250 = Vd 10
256 = Vd 9
256 = Vd 8
512 = Vd 7
200 = Vd 6
125 = Vd 5
125 = Vd 4
Top 0 = Vd 3
100 = Vd 2
100 = Vd 1 (MSB)

INCREMENTAL OPTICAL CODE READER, PARTICULARLY OF THE WHOLLY INTEGRATED TYPE

The present invention relates to a reader of an incremental optical code contained on a disk with coded tracks. The reading is advantageously performed by diascopy, in other words by differential reading of transparent and opaque zones of the disk.

It is known that such an incremental reader comprises, in combination with a disk comprising several concentric tracks each having a succession of fine alternating opaque zones and transparent zones, at least one light source adapted for illuminating the tracks and a code reader assembly which emits electric pulses representing the relative incremental angular position of two elements of an assembly which are movable with respect to each other, as well as a so called "0 blip" for initializing the relative angular position.

Incremental optical code readers are more and more widely used, one of their applications (to which the invention applies particularly) being that of determining the incremental angular position of the mobile elements of a robot, by providing in this case a reading device for each mobile element.

Although the invention applies particularly to the reading of a coded disk by diascopy, that is to say by transparency, it may also apply to reading a coded disk by reflection and also to reading a coded strip while determining in this case not an angular position but a relative linear movement between two elements, one of which is mobile in translation with respect to the other, the strip being carried by one of these two elements.

However, the present will describe only the incremental reading by diascopy of a coded disk including several concentric tracks.

Conventionally, a device for the incremental reading of a coded disk comprises at least one light source formed either by a filament lamp emitting light through a wide spectrum which comprises the visible and the near infrared (the near infrared being the zone of maximum sensitivity for photodetectors, particularly silicon photodetectors), the filament lamp illuminating through an appropriate optical system all of the tracks of the disk, or by an assembly of light emitting diodes emitting generally in the near infrared (in the 0.8 to 0.9 micron band).

The device also comprises a code reading assembly which cooperates with the coded disk and the light source or the light sources, and which includes first a series of photodetectors equal to the number of tracks, these photodetectors being formed more particularly by photodiodes or phototransistors which are in the form of either discrete components or disposed in a common case. In both instances, the number of photodetectors is equal to the number of light emitting diodes when the light source is formed by such diodes.

The photodetectors of the prior art deliver very weak signals and thus they are followed by amplifiers, more particularly by operational amplifiers available commercially formed by integrated circuits with wired discrete components on a printed circuit; or else hybrid or specific "prediffused circuits" are used, generally comprising as many amplifiers as there are coded tracks (hereafter we will speak of reading channels, namely one channel per track of the coded disk).

For each channel, the amplifier is followed conventionally by a shaping circuit, formed generally by a trigger of the Schmitt trigger type, which generates pulses with a steep edge in response to each transparent zone of the track corresponding to the channel in question. Advantageously the Schmitt triggers are disposed in the same case or the amplifiers and the Schmitt triggers, are provided in a hybrid form or in a prediffused circuit. There must further be provided for each Schmitt trigger, that is to say for each channel, an adjustment element for adjusting the triggering threshold of the trigger so as to ensure, despite variations in sensitivity of the photodetectors, correct operation of each channel and good accuracy in switching the subsequent electronic units.

In fact it is necessary, for a large number of applications of code reading devices, to carry out logic processing, for transmitting the information obtained, for each channel, by a photodetector-amplifier-Schmitt trigger assembly.

Particularly, means are generally provided for calibrating the zero blip which ensures the constancy of the initial time of each blip, and, therefore, the exact setting of the beginning of an incremental reading.

The transmission of information from the reading device is conventionally provided by using, as interface circuits, line transmitters and receivers which are constituted by commercial chips. Finally, the supply voltage is adjusted and filtered inside the reading device and the light source.

It is further necessary, in most cases, to compensate for the fluctuations or drift of the single light source or light sources so as to ensure correct operation of the assembly throughout a wide temperature range.

The assembly formed by the power supply, its central and filtration means, and for compensating the fluctuation of the light source or sources is provided conventionally by means of commercially available components.

It will be readily understood that the incremental reading device which has just been described above, requires, in the usual construction, a large number of components which, once wired to a printed circuit, occupy a considerable volume and are relatively expensive, while offering only limited reliability.

To overcome these drawbacks it has been proposed to constitute by hybridation the electronic part (amplifiers, Schmitt triggers, logic means), or to divide the electronic part in several large functional blocks, provide each of these blocks as a prediffused circuit, or to combine hybridation and prediffused circuits. These three types of solutions reduce the space required and improve the reliability, but practically do not reduce the cost of the assembly of the incremental code reading device (light source and associated reading device properly speaking).

The present invention aims at improving simultaneously the above mentioned problems of known reading devices, by reducing the space required, by increasing the reliability and by reducing the cost, while further allowing the whole of the reading device to be tested without increasing the complexity of the system, and/or the resolution of the incremental optical code reading device to be chosen by simple programming without changing the coded disk.

For this, the invention aims at providing the different opto-electronic (photodetectors), analog (amplifiers, etc), logic (triggers, gates, etc) and interface (three state gates, etc) components so as to be able to integrate these components on a silicon chip, or possibly a reduced number of silicon chips, while further providing on this chip or chips means for testing the reading assembly and/or means for choosing the resolution of the reading device and possibly means providing other functions. Thus the dimensions and cost of the reading device are considerably reduced while increasing the reliability and reducing fluctuations.

The present invention provides an incremental optical code reading device, which cooperates with an element moving relatively to this reading device comprising a first series of n coded tracks with a succession of elementary zones for two types of retransmission of the light received and a second series of n tracks, each of these latter tracks being coded complementarily to one of the tracks of the first series. The increment optical code reader comprises a light source, for illuminating the tracks of the two series, and illumination determining means for determining whether light is retransmitted by an observed elementary zone of each of the tracks or not. The illumination determinating means, which are carried by 1 to p chips (p being an integer), comprising for each of the tracks of the coded element, a pair of photodiodes, a differential amplifier whose two inputs receive the signals emitted by the two photodiodes, a trigger giving a steep leading edge to the signals received from the output of the differential amplifier, and an electronic assembly with logic gates receiving the outputs of said triggers and delivering, on at least there outputs, the position representative signals for two channels offset by $\pi/2$ and a calibrated blip.

In the preferred embodiments, the code carrying element is a disk and the opaque or transparent zones thereof are read by diascopy, that is to say by light either transmitted or not transmitted through the respectively transparent and opaque zones of the disk.

Further, the differential amplifier may be formed by two parallel amplifiers, each receiving the output of one of the two photodiodes of the pair of coupled photodiodes and by a comparator whose two inputs each receive the output of one of the two above mentioned amplifiers disposed in parallel.

The amplitude shift is provided in the triggering caused by the rising part, and the falling part of the signal delivered by the differential amplifier, that is to say a hysteresis of the comparator, in the preferred embodiment of this differential amplifier.

The reading device comprises means for delivering, to the photodiodes or the inputs of the differential amplifiers, signals adapted for simulating at the output of the diodes or the input of the amplifiers respectively, the bit level "0" or "1".

The electronic logic gate assembly also delivers at a fourth output a signal at a maximum frequency representative of the relative speed of movement of the element moving relatively to the reading device.

The reading device comprises, in the electronic gate assembly, additional gates for generating by logic combination fictitious tracks in addition to the tracks provided on the relatively moving element and means for controlling these additional gates so as to cause either the real tracks of this element or the fictitious tracks selected to operate.

The invention will in any case be well understood from the complement of description which follows and from the accompanying drawings.

According to the present invention an optical code reading device, more particularly of the wholly integrated type, may be constructed substantially as follows.

Figure 1:
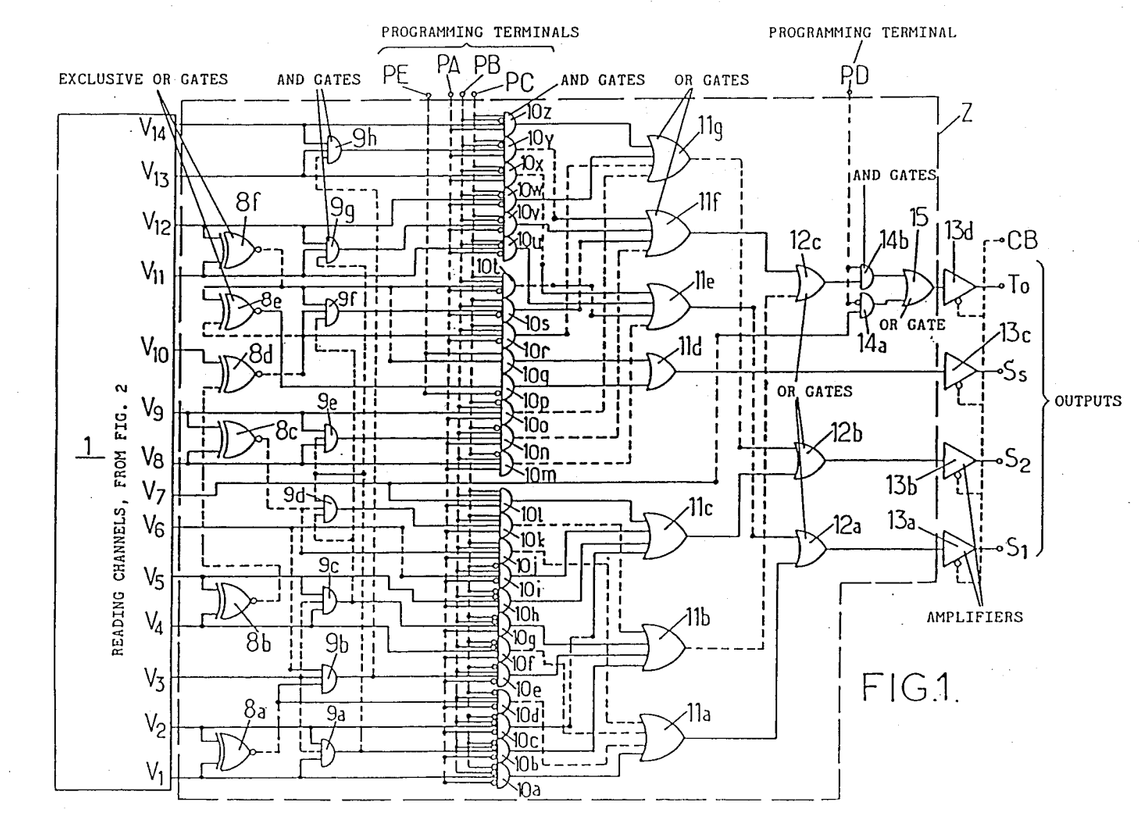
FIG. 1 shows schematically, in the form of blocks, a reading device including the improvements of the present invention, completely integratable on a chip for 14 channels, the light source not being shown.
Figure 2:
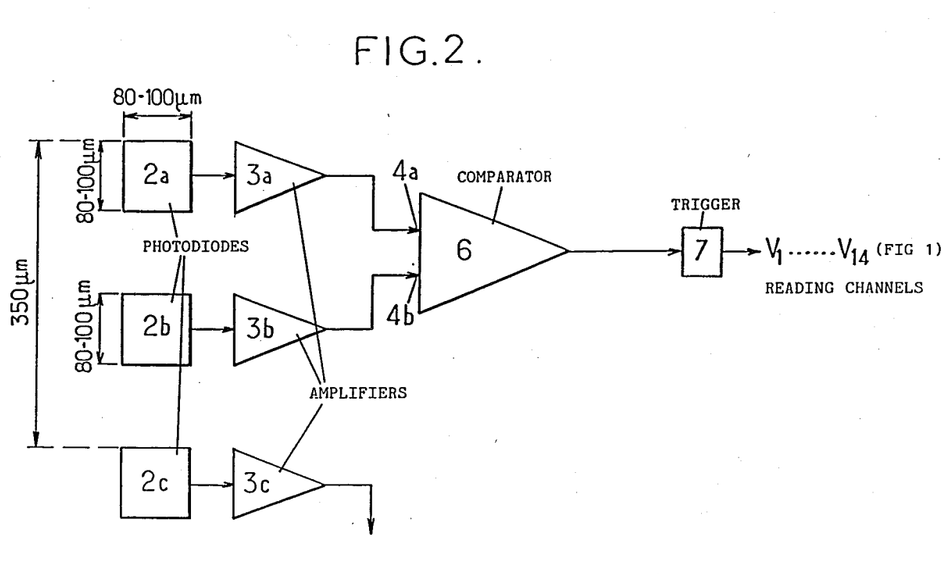
FIG. 2 shows one of the reading channels with a comparator followed by a trigger.

Referring to FIGS. 1 and 2 which illustrate respectively the whole and a part of the wholly integrated reading device for 14 channels, it can be seen that this device includes a system 1 with 14 reading channels V1 to V14, one of these channels being shown in detail of FIG. 2.

Each reading channel (FIG. 2) comprises a pair of photodiodes 2a, 2b, each one being a square of 80 to 100 microns per side, working in differential, one of the diodes 2a reading one of the coded tracks (of the first series of tracks), whereas the other diode 2b reads an associated track (of the second series of tracks) having zones complementary to the corresponding zones of the first track.

The output of each of the diodes 2a, 2b is amplified in an amplifier 3a, 3b and the outputs of the two amplifiers are each connected to an input 4a, 4b of a comparator 6.

The output of comparator 6, which is an alternating signal, is shaped by a trigger 7 of the Schmitt trigger type whose output is formed by a rectangular signal.

Comparator 6 introduces hysteresis in the signal for avoiding oscillations in the vicinity of balance, as will be explained with reference to FIGS. 3 and 4.

It should be mentioned that FIG. 2 also shows a part of a neighboring channel, namely the photodiode 2c and the amplifier 3c therefore, and the approximate distances have been shown concerning the photodiodes for showing the small space required by the 14 pairs of photodiodes. It can in particular be seen that the width of a channel is 350 microns.

Finally, a test unit (not shown) may be provided which is adapted for acting on the initial part of the channels V1 to V14 for controlling the simulation of "1" or "0" bits at the inputs of the amplifiers, such as 3a and 3b of FIG. 2, or else at the output of the diodes, such as 2a and 2b of FIG. 2.

Figure 3:
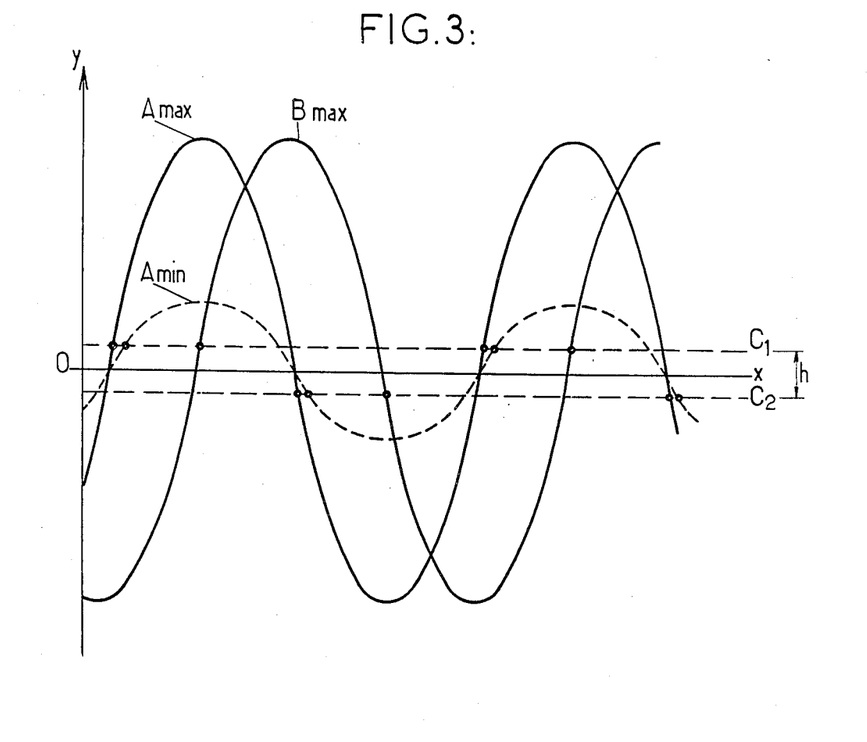
FIG. 3 illustrates combined signals entering the comparator of FIG. 2.

In FIG. 3 there have been shown two signals of extreme amplitudes, A max and A min delivered by the differential amplifier 6 and representing the output of a reading channel (for example channel 1). The signal B max represents the output, at maximum amplitude, of the channel offset by $\pi/2$ with respect to the signal A max (or A min).

The hysteresis of the trigger is shown by the amplitude variation h between the triggering points of trigger 7 on rising (horizontal line C1) and on falling (horizontal line C2). These two horizontal lines C1 and C2 are shown with broken lines on each side of the axis Ox of the abscissa, the amplitudes being plotted along the axis of the ordinate Oy. These points show the intersection of curves A max, A min and B max with the horizontal line C1 on rising and with the horizontal line C2 on falling. These are the triggering points trigger 7.

Figure 4:
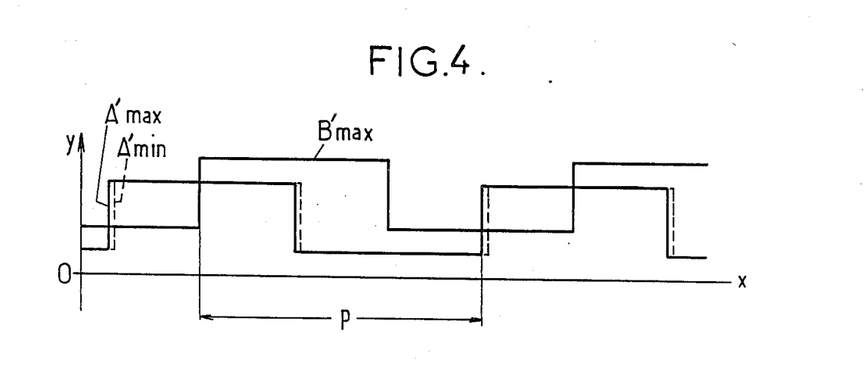
FIG. 4 illustrates pulses leaving the trigger or flip flop of FIG. 2.

The signals shown in FIG. 3 form the inputs of the Schmitt triggers or flip flops 7 of each channel, whereas in FIG. 4 the outputs of these triggers have been shown, which outputs are formed by rectangular signals. At the output of a trigger, A max has become A' max, whereas A min has become A' min. It can be readily seen that the maximum amplitude signal A max and the minimum amplitude signal A min are transformed into a signal A' max and a signal A' min, respectively, with simply a slight shift in time. The cyclic ratio for A' max and A' min being independent of the amplitude of the input signal between A min and A max.

FIG. 4 also shows the output signal B' max of the trigger 7 corresponding to the input signal B max, B' max being offset by $\pi/2$ with respect to A' max or A' min. In this Figure, the duration of a period is shown as p.

Referring to FIG. 1, in which assembly 1 is formed by 14 channels V1, V2, V3, V13, . . . , V14 each identical to channel 2a–3a, 2b 3b, 6, 7 of FIG. 2.

An electronic logic gate assembly Z is disposed between the outputs of channels V1 to V14 of the reading assembly and four outputs S1, S2, Ss and To.

The outputs S1 and S2 are provided for delivering output signals for two channels offset by $\pi/2$, so as to be able to detect the direction of rotation of the coded disk by determining, among the signals offset by $\pi/2$, the signal which is in advance on the other;

The output Ss is relative to a special channel, derived from channels V1 to V14 which is at a maximum speed or frequency and provides tachymetric information concerning the relative rotational speed of the coded disk.

The output To provides a calibrated zero blip signal.

The outputs S1, S2, Ss and To are of the three state type and they are controlled from a terminal CB.

The electronic assembly Z comprises AND gates illustrated by a semicircle with vertical base, OR gates represented by shields, "EXCLUSIVE OR" gates represented by shields with a double line on the left and NON gates (performing the inversion function) shown by small circles disposed either at the input, or at the output of one of the gates of the three preceding types.

It will be recalled that these gates comprise a single output which is fed:
for the AND gates, when all the inputs are simultaneously fed;
for an OR gate when at least one input is fed;
for an "exclusive OR" gate, when one and only one input is fed;
for a NON gate (inversion function), when the single input thereof is not fed.

This electronic logic gate assembly Z serves first of all for feeding, from the outputs V1 to V14 of the reading assembly 1, the outputs S1, S2, Ss and To.

The electronic logic gate assembly 2 also serves for generating fictitious tracks (not etched on the coded disk) by combining logically the outputs of tracks thereby allowing are etched, which among other things, double the limit resolution with respect to the resolution which may reasonably be etched on a coded disk and to reduce the number of reading channels.

It also serves for calibrating the zero blip for each real or fictitious resolution.

It will be noted that, for facilitating reading of FIG. 1, some of the connections between gates are shown with continuous lines and some with broken lines. (In the corresponding integrated circuit these two types of connections may extend for example in different planes).

The nature and the interconnections of the gates of FIG. 1 will now be explained.

Six "exclusive OR" gates 8a, 8b . . . 8e, 8f, each with two inputs, are driven by the channels leaving assembly 1 or by the outputs of the following gates 8: V1 and V2 for 8a, V4 and V5 for 8b, V8 and V9 for 8c, V10 and the output of 8b for 8d, the output of 8d and the output of 8f for 8e, finally V11 and V12 for 8e.

It will be noted that circles are shown at the output of the six "exclusive OR" gates 8a to 8f so as to show the "inverted exclusive OR" or coincidence function, referenced X+Y, for inputs X and Y, in the truth tables of FIGS. 5 to 7 which will be described hereafter, the signal + representing the "exclusive OR" function.

Eight AND gates 9a, 9b, . . . 9g, 9h, each with three inputs, are driven by the channels V1 to V14 or the outputs of other gates of the series 8 (after inversion) and 9.

In particular:
gate 9a receives V1, V2 and V3.
gage 9b receives V3, V6 and the output of gate 8a (after inversion);
gate 9c receives V3, V4 and V6;
gate 9d receives the outputs of gates 8c (after inversion), 9a and 9c;
gate 9a receives V8, V9 and the output of gate 9a;
gate 9f receives the outputs of gates 8d (after inversion), 8f (after inversion) and 9c;
gate 9g receives V11, V12 and the output of gate 9a; and
gate 9h receives V13, V14 and the output of gate 9b.

Twenty-six AND gates 10a, 10b, . . . 10y, 10z, each with four inputs (except gates 10p and 10q which have two inputs), receive a channel V1 to V14 or a gate output of the series 8 (after inversion) and 9 and three orders (or only one order for gates 10p and 10q) from the three terminals PA, PB, and PC for programming the resolution (or from terminal PE which programmes the maximum frequency output towards the output Ss for gates 10p and 10q).

It will be noted that some AND gate inputs of series 10 comprise an inhibit signal (small circle)

In the table below of the inputs of these gates of series 10 the arrivals at the inhibited gates have been indicated by a bar (—) thereover.

| Gate | Inputs |
| --- | --- |
| 10a | V1; $\overline{PA}$, $\overline{PB}$, $\overline{PC}$ |

-continued

| Gate | Inputs |
|---|---|
| 10b | output of 9a; $\overline{PA}$, $\overline{PB}$, $\overline{PC}$ |
| 10c | V2; $\overline{PA}$, $\overline{PB}$, $\overline{PC}$ |
| 10d | inverted output of 8a; $\overline{PA}$, PB, $\overline{PC}$ |
| 10e | output of 9b; $\overline{PA}$, PB, $\overline{PC}$ |
| 10f | V4; PA, $\overline{PB}$, $\overline{PC}$ |
| 10g | output of 9c; PA, $\overline{PB}$, $\overline{PC}$ |
| 10h | V5; PA, $\overline{PB}$, $\overline{PC}$ |
| 10i | V6; $\overline{PA}$, PB, $\overline{PC}$ |
| 10j | inverted output of 8c; PA, PB, PC |
| 10k | output of 9d; PA, PB, PC |
| 10l | V7; PA, PB, PC |
| 10m | V8; PA, PB, $\overline{PC}$ |
| 10n | output of 9e; PA, PB, $\overline{PC}$ |
| 10o | V9; PA, PB, $\overline{PC}$ |
| 10p | inverted output of 8e; $\overline{PE}$ |
| 10q | inverted output of 8f; PE |
| 10r | inverted output of 8d; $\overline{PA}$, PB, PC |
| 10s | output of 9f; $\overline{PA}$, PB, PC |
| 10t | inverted output of 8f; $\overline{PA}$, PB, PC |
| 10u | V11; $\overline{PA}$, $\overline{PB}$, PC |
| 10v | output of 9g; $\overline{PA}$, $\overline{PB}$, PC |
| 10w | V12; $\overline{PA}$, $\overline{PB}$, PC |
| 10x | V13. PA, $\overline{PB}$, PC |
| 10y | inverted output of 9h; PA, $\overline{PB}$, PC |
| 10z | V14; PA, $\overline{PB}$, PC |

Seven OR gates 11a, 11b ... 11f, 11g each with four inputs (except the OR gate 11d which has only 2 inputs), combine the outputs of the AND gates of the series 10 as follows:

the gate 11a receives the outputs of gates 10a, 10d, 10f and 10j;

gate 11b receives the outputs of gates 10b, 10e, 10g and 10k;

gate 11c receives the outputs of gates 10c, 10h, 10i and 10l;

gate 11d receives the outputs of gates 10p and 10q;

gate 11e receives the outputs of gates 10m, 10t, 10u and 10x;

gate 11f receives the outputs of gates 10n, 10s, 10v and 10y;

gate 11q receives the outputs of gates 10o, 10r, 10w and 10z.

It will be noted that an AND gate output of series 10 feeds an input and only one of the OR gates of series 11 (there are 26 AND gates of series 10 and 26 inputs of OR gates of series 11, namely six OR gates with four inputs: and one OR gate with two inputs $4 \times 6 + 2 = 26$).

The outputs of six OR gates 11a, 11b, 11c, 11e, 11f, 11g, among the seven OR gates in series 11, are combined by three OR gates 12a, 12b, 12e with two inputs each.

Gate 12a receives the outputs of gates 11a and 11e, the gate 12b receives the outputs of gates 11c and 11g and gate 12c the outputs of gates 11b and 11f.

The outputs of gates 12a and 12b are connected to the outputs S1 and S2 respectively, by amplifiers 13a and 13b respectively, controllable from the terminal CB, whereas gate 11d feeds the output Ss through the amplifier 13c, also controllable from the terminal CB.

The electronic logic gate assembly Z also includes two AND gates 14a and 14b each with two inputs, the outputs of the AND gates are combined in an OR gate 15 with two inputs.

Gate 14a receives channel V7 and a signal ensuring programming of the zero blip from a terminal PD.

Gate 14b receives the output of gate 12c and from the same terminal PD the signal programming the zero blip.

The output of the OR gate 15 is finally delivered to the To output of the zero blip through a buffer 13d which receives an output control signal from the terminal CB.

Figure 5:
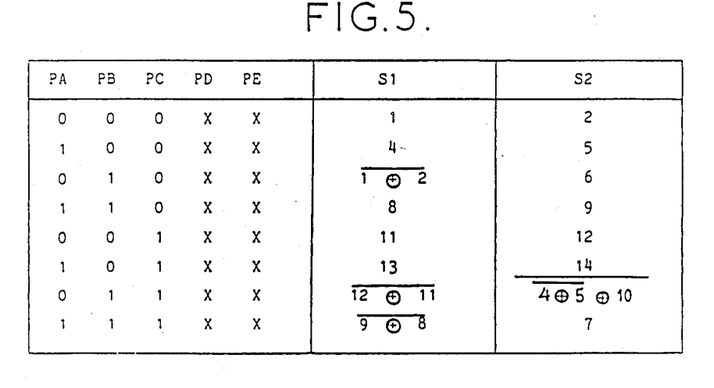
FIGS. 5, 6 and 7 show the truth tables corresponding to the electronic diagram of FIG. 1, for the two channels offset by $\pi/2$, the 0 blip and the fastest channel or tachymetric channel, respectively.
Figure 6:
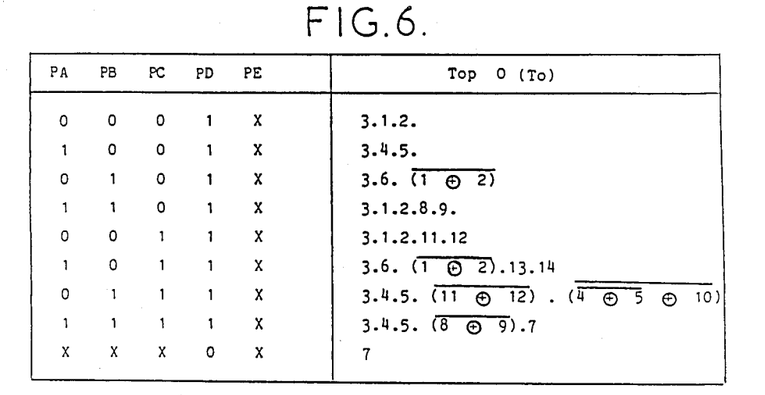
Figure 7:
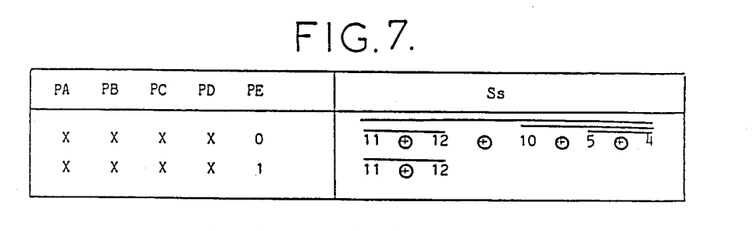

FIGS. 5, 6, 7 show the truth tables giving the output signals of S1 and S2 for FIG. 5, of To (zero blip) for FIG. 6 and Ss for FIG. 7, respectively.

In FIG. 5, the control signal triggering the output of signals on S1 and S2 originate from terminals PA, PB, PC, PD and PE and, depending on whether these terminals are actuated or not, the outputs on S1 and S2 are different; the actuation is shown by the digit "1", non actuation by the digit "0", and when it is immaterial whether a terminal is actuated or not the letter X is shown, the indications "1", "0", and "X" being shown in the columns corresponding to terminals PA, PB, PC, PD and PE.

In the columns of outputs S1 and S2 appear numbers from 1 to 14 for representing the channels V1, to V14 using the conventional signals for the "exclusive OR" and the AND gates (as indicated at the bottom of the drawing of FIGS. 5 to 7) and by including a bar (—) for the inversion function (NON gate).

In FIGS. 6 and 7 the same symbols have been used as in FIG. 5 for the outputs To and Ss.

In short, in the tables of FIGS. 5 to 7, which form an integral part of the present description (they have been illustrated as Figures only for practical reasons), it is possible to read which are the channels or logic combinations of channels which are available at the outputs S1, S2, To and Ss depending on the actuated terminals PA, PB, PC, PD and PE; the input signals 1 to 14 (of channels V1 to V14) which appear either as they are or combined on the above mentioned outputs representing the relative position of the coded disk and of the reading device with respect to the etching on the disk.

Figure 8:
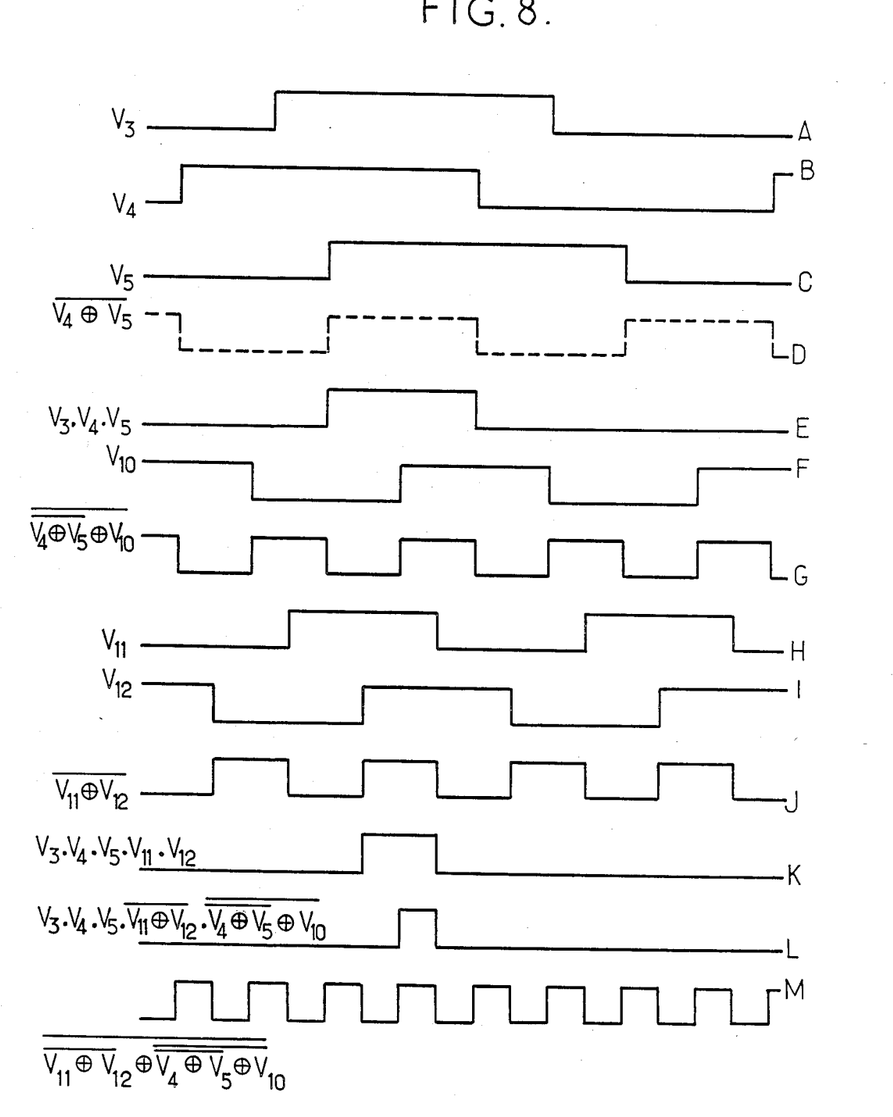
FIG. 8 illustrates the electric signals at different points of the diagram of FIG. 1 before and after processing in the logic gates.

In FIG. 8 is shown the logic signals (signals A, B, C, F, H and I) leaving the reading system and the logic signals (signals D, E, G, J, K, L and M) obtained by logic combinations.

These signals A to M in FIG. 8 are formed, by way of example as follows:

(a) Logic signals leaving the reading system:
"A": channel V3 with a single blip per revolution of 1/2.600th;
"B" and "C": respectively channels V4 and V5 of 1250 periods per revolution, offset by $\pi/2$;
"F": channel V10 with 2500 periods per revolution, offset by $\pi/4$ with respect to the channel V12 ("I");
"H" and "I": respectively channels V11 and V12 of 2500 periods per revolution, offset by $\pi/2$;

(b) Logic signals obtained by logic combination:
"D": signal of 2500 periods per revolution obtained by combining in an "inverted exclusive OR" circuit (coincidence function), the channels V4 and V5 ("B" and "C");
"E": the zero blip for 1250 periods per revolution is obtained by combining an AND gate the channels V3, V4 and V5 ("A", "B" and "C");
"G": signal of 5000 periods per revolution obtained by combining the result "D" and the channel V10 ("F") in an "inverted exclusive OR" circuit;
"J": signal of 5000 periods per revolution offset by $\pi/2$ with respect to "G", obtained by combining the channels V11 and V12 ("H" and "I") in an "inverted exclusive OR" circuit;
"K": the zero blip for 2500 periods per revolution is obtained by combining the channels V3, V4, V5, V11 and V12 ("A", "B", "C", "H", "I") in an AND gate or more precisely the 1250 period blip per revolution "E" and the channels V11 and V12 in an AND gate;
"L": the zero blip for 5000 periods per revolution is obtained by combining in an AND gate the 1250 period blip per revolution "E" with the two signals of 5000 periods per revolution "G" and "J";
"M": signal of 10,000 periods per revolution obtained by combining the 5000 periods per revolution signals "J" and "G" in an "inverted exclusive OR" circuit.

It can be seen that depending on the programming of terminals PA, PB, PC, PD, PE the following may be obtained at the outputs S1, S2, Ss and To;

two channels offset by $\pi/2$ of 1250 periods/revolution ("B" and "C") with calibrated zero blip "E" at S1, S2 and To; and two channels offset by $\pi/2$ of 2500 period/revolution ("H" and "I") with calibrated zero blip "K" at S1, S2 and To; and two channels offset by $\pi/2$ of 5000 periods/revolution ("G" and "J") with calibrated zero blip "L" at S1, S2 and To; and 5000 periods or 10,000 periods at Ss, whatever the numbers of periods at S1 and S2 (this channel, available in Ss, is particularly intended for supplying tachymetric or speed information).

The result is that, with only six reading channels for a single coded disk, information may be obtained equivalent to that obtained with three incremental coded disks comprising a total of 12 tracks (3 to 5 tracks for each coded disk) without needing to etch on the disk a channel comprising more than 2500 periods.

In practice, the use of the 14 channels (V1 to V14) of the incremental reading device is optimized by taking into account the limits of resolution for a given size of the coded disk and the resolutions which are most required by the user.

Figure 9:
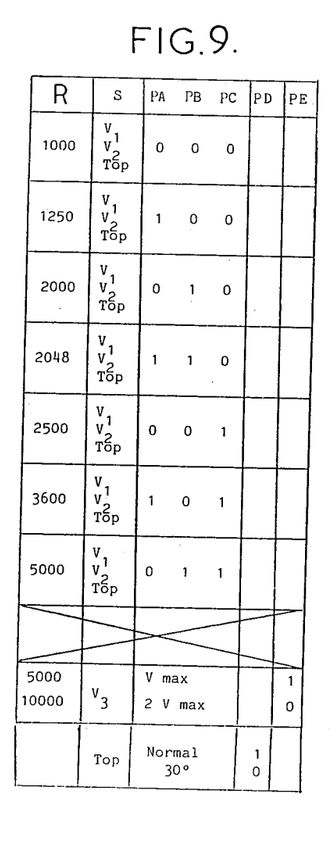
FIGS. 9, 10 and 11 are truth tables showing the resolutions of three coded disks numbered I, II and III, respectively, which are adapted for cooperating with the incremental reader of the invention.
Figure 10:
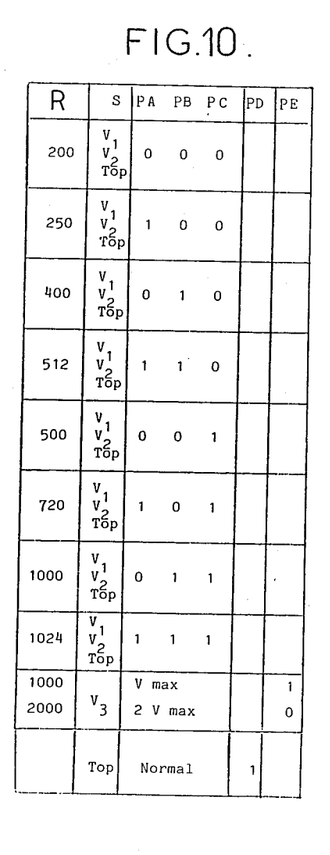
Figure 11:
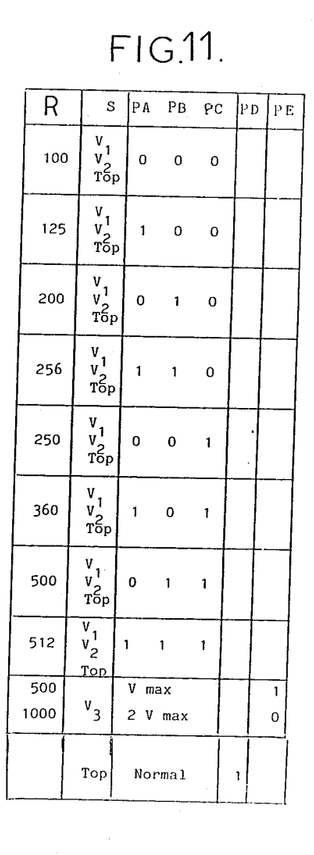

By way of example, the resolutions of three coded disks have been illustrated in FIGS. 9, 10 and 11 using the same reading device for these three types of disks. The columns PA, PB, PC, PD, PE correspond to the terminals bearing these references "1" indicating the actuation and "0" the non actuation of the terminal. Finally, column R indicates the resolution.

FIG. 9 shows a coded disk no. I of size 23 (having a diameter of 58 mm) and having resolutions of 1000, 1250, 2000, 2048, 2500, 3600 and 5000 periods per revolution on two channels offset by $\pi/2$ at S1 and S2, a calibrated or special blip (30°) at To and 5000 or 10,000 periods at Ss. This is a high quality disk of size 23.

In FIG. 10 has been illustrated a different coded disk no. II also of size 23 (having a diameter of 58 mm) but of poorer quality, with resolutions of 200, 250, 400, 512, 500, 720, 1000 and 1024 periods per revolution on two channels offset by $\pi/2$ at S1 and S2, a calibrated blip at To and 10,000 or 2000 periods per revolution at Ss.

FIG. 11 illustrates another coded disk number III of smaller size, i.e., of size 11 (having a diameter of 27 mm) and having resolutions of 100, 125, 200, 256, 250, 360, 500, 512 per revolution on two channels offset by $\pi/2$ at S1 and S2, a calibrated blip at To and 500 or 1000 periods at Ss.

Figure 12:
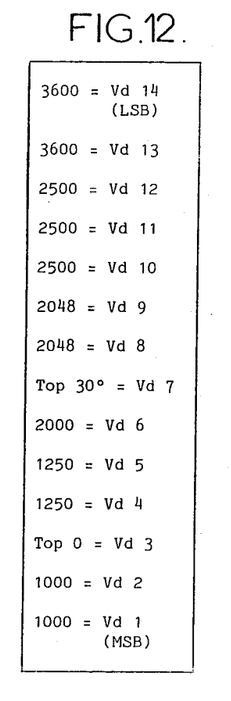
FIGS. 12, 13 and 14 show schematically the resolution and the position of the different channels for the coded disks numbered I, II and III, respectively, of FIGS. 9, 10 and 11.
Figure 13:
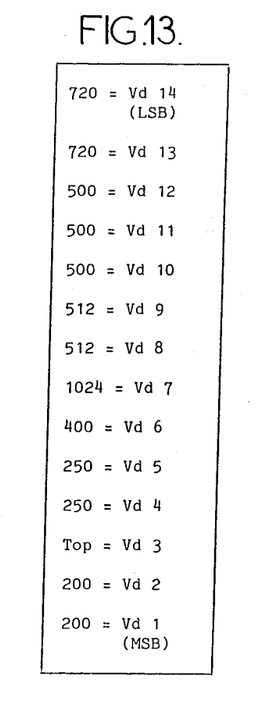
Figure 14:
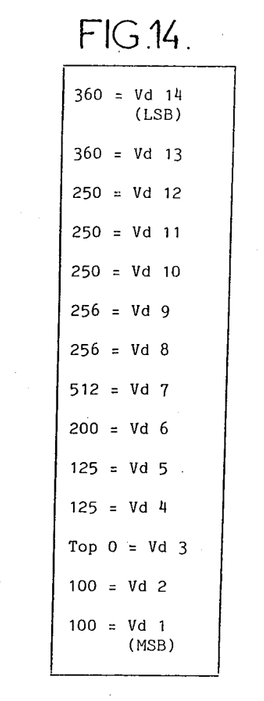

FIGS. 12, 13 and 14 show the resolution and the position of the different channels for disk numbers I, II and III of, FIGS. 9, 10 and 11, respectively, the channels on the disks being referenced as Vd1, Vd2, ... Vd13, Vd14.

The reading assembly of FIG. 1 operates in conjunction with a single light emitter, for example an AsGa diode operating in the near infrared and fed with current, through a simple resistor connected to the voltage Vcc; this diode illuminates the integrated circuit of FIG. 1, through a suitable optical system, and the transparent zones of the coded disk. The integrated circuit of FIG. 1 is protected either by a coating transparent to infrared, or by placing it in a case with a glass window.

An integrated circuit in accordance with FIG. 1 has been effectively built with CMOS technology on an area less than 15 mm$^2$. Such an integrated circuit provides the reading of 100,000 periods per second, the transmission taking place through the output stages S1, S2, Ss, To by the usual means.

It can be seen that the invention allows a completely integrated incremental optical reading device to be constructed on one or a small number of chips with reduced space occupancy and cost and with very great reliability and safety. Furthermore, the circuit may provide additional functions, such as circuit testing function, and also the direction and speed of rotation determining function.

The very small space required by the two channels and the blip even allows the number of integrated channels on a single circuit to be increased so as to obtain in the same apparatus, with a single type of coded disk and a single reading device, several different resolutions (7 or 8 for example with only 14 elementary reading channels).

To simplify the output connections, the resolution which it is desired to use may be programmed and this resolution will alone be present in the transmission stages of the two channels offset by a quarter of a period and of the blip.

The result is that, with a single reading device and with a single type of coded disk, 7 or 8 different resolutions may be available (for example 5000, 3600, 2500, 2048, 2000, 1250, 1000 periods per revolution, on two channels and a calibrated blip each time), which provides standardization of manufacture, simplicity of stock management, distribution, design and maintenance.

The possibility of choosing the resolution for a given coded disk, by simple programming, has the advantage of allowing this resolution to be readily modified, for example as a function of preliminary tests, without having to change the coded disk.

Furthermore it is possible to avoid, a geometry of the reading channels of the device which has just been described provided identical to that used in an absolute reading device of an optical code of the type described in U.S. patent application Ser. No. 870,793 filed June 5, 1986, corresponding to French patent application No. 85 09 076 filed by the assignee on the June 14, 1985, for an optical code reading device, particularly of the wholly integrated type" with a chip, or possibly a small number of chips, having the same dimensions and the same references, and the same type of case, and to use the same drive system for a device in accordance with the present invention and for a device according to the above mentioned patent application.

Integration does not only provide a large choice of resolutions, programmable with a single device, but can also be carried out in very small sized apparatus (size 11 for example), which is impossible to achieve with another technology.

The advantage for the constructor is threefold:
- it is sufficient to have a single disk, a single reticle and a single reader, which results in reducing the stocks of finished products and elementary parts;
- for a given coded disk, the difference between incremental reading devices in accordance with the present invention and an absolute reading device in accordance with the above mentioned patent application resides exclusively in the etching of the coded disk and the chip of the reader; all the other parts may be identical, which provides standardization and reduction of the stocks of raw and current materials;
- the commercial management is simplified and delays are reduced.

The advantage for the user is also very great, as a single model of disk is sufficient because of the programmable resolution which provides standardization and reduction of stocks, without compromising on the resolution and less expensive maintenance the result is finally a better service at a lower cost.

A device of the present invention may be applied in particular to the circuits described in the French patent applications No. 83 06482 filed on the Apr. 20, 1984 (which corresponds to U.S. patent application Ser. No. 600,452 filed Apr. 16, 1984, now U.S. Pat. No. 4,622,461 and continuation-in-part patent application Ser. No. 661,971 filed Oct. 17, 1984, now U.S. Pat. No. 4,644,458) and No. 84 10689 filed on the July 5, 1984, as well as 84 19711 filed on Dec. 21, 1984 (corresponding to U.S. patent application Ser. No. 810,722 filed Dec. 19, 1985) and No. 84 19713, filed on the Dec. 21, 1984 (corresponding to U.S. patent application Ser. No. 810,721 filed Dec. 19, 1985) each comprising an optoelectronic reader 10 which may be constructed as described above. As is evident, the present invention is not limited to the embodiment described above, but embraces all modifications known to those of ordinary skill in the art which are within the scope of the following claims.

We claim:

1. An incremental optical code reading device for reading a code-carrying element moving relatively thereto, said code-carrying element including a first series of n (n being an integer) coded tracks, each with a succession of elementary zones of two types for retransmission of light received, and a second series of n tracks, each of which are coded complementarily to respective tracks of the first series of tracks, said reading device comprising:
  a light source for illuminating the coded tracks of the first and second series of tracks; and
  illuminating determining means for determining whether or not light is retransmitted by an elementary zone on each of the first and second tracks, said illumination determining means, being formed on 1 to p I.C. chips (p being an integer), and including for each of the tracks of the code-carrying element, one pair of photodiodes, a differential amplifier with two inputs receiving signals outputted by the two photodiodes, a trigger giving a steep leading edge to signals received from the output of the differential amplifier, and an electronic logic gate assembly with logic gates receiving outputs of each trigger and outputting the position representative signals for two channels of said code-carrying element offset by $\pi/2$ and a calibrated blip for setting a read time.

2. The device according to claim 1, wherein the code-carrying element is a disk on which each track is constituted by transparent and opaque zones, and reading of the opaque and transparent zones thereof is achieved by light being transmitted or not transmitted through the transparent and opaque zones of the disk, respectively.

3. The device according to claim 1, further comprising amplitude shift means for shifting the amplitude of the signal outputted by the differential amplifier.

4. The device according to claim 1, further comprising means for feeding, either to the photodiodes or to the inputs of the differential amplifiers, signals adapted for simulating the bit level "0" or "1" at the output of the photodiodes or the input of the differential amplifiers.

5. The device according to claim 1, wherein said electronic logic gate assembly further outputs a maximum frequency signal representative of the relative speed of movement of the code-carrying element relative to the reading device.

6. The device according to claim 1, wherein the electronic logic gate assembly further includes additional gates for generating fictitious tracks in addition to the tracks provided on the code-carrying element and means for controlling said additional gates so as to operate using either the tracks of the code-carrying element or said fictitious tracks.

7. The device according to claim 1, wherein each differential amplifier is formed by two amplifiers in parallel, each receiving the output one of the two photodiodes of the pair of coupled photodiodes, and by a comparator having two inputs, each input receiving the output of one of said two amplifiers disposed in parallel.

8. The device according to claim 7, wherein said comparator of each differential amplifier provides hysteresis to a signal output thereby.

* * * * *